United States Patent
Riekki et al.

(10) Patent No.: US 8,436,684 B2
(45) Date of Patent: *May 7, 2013

(54) APPARATUS AND METHOD FOR LOW NOISE AMPLIFICATION

(75) Inventors: Jonne Juhani Riekki, Espoo (FI); Jari Johannes Heikkinen, Espoo (FI); Jouni Kristian Kaukovuori, Vantaa (FI)

(73) Assignee: Renesas Mobile Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/528,222

(22) Filed: Jun. 20, 2012

(65) Prior Publication Data

US 2013/0057346 A1    Mar. 7, 2013

Related U.S. Application Data

(63) Continuation of application No. 13/224,430, filed on Sep. 2, 2011.

(30) Foreign Application Priority Data

Sep. 2, 2011 (GB) .................................. 1115183.4

(51) Int. Cl.
  *H03F 3/191* (2006.01)
(52) U.S. Cl.
  USPC ........................................... 330/302; 330/85
(58) Field of Classification Search .................. 330/302, 330/310–311, 284, 252–261
  See application file for complete search history.

(56) References Cited

U.S. PATENT DOCUMENTS

| | | |
|---|---|---|
| 6,094,084 A | 7/2000 | Abou-Allam et al. |
| 6,175,274 B1 | 1/2001 | Groe |
| 6,768,377 B2 | 7/2004 | Macedo |
| 6,933,779 B2 | 8/2005 | Lee et al. |
| 6,949,979 B2 | 9/2005 | Lu et al. |
| 7,084,707 B2 | 8/2006 | Razavi et al. |
| 7,266,360 B2 | 9/2007 | Kang et al. |
| 7,323,939 B2 | 1/2008 | Han et al. |

(Continued)

FOREIGN PATENT DOCUMENTS

| | | |
|---|---|---|
| CN | 101951229 | 1/2011 |
| EP | 0 837 559 A1 | 4/1998 |

(Continued)

OTHER PUBLICATIONS

Notice of References Cited, issued in related U.S. Appl. No. 13/556,552 on Sep. 6, 2012 (1 page).

(Continued)

*Primary Examiner* — Hieu Nguyen
(74) *Attorney, Agent, or Firm* — Robert P. Michal; Lucas & Mercanti, LLP

(57) ABSTRACT

Embodiments provide an amplifier and a method for using and manufacturing said amplifier that incorporate an impedance matching stage, a feedback circuit, and a gain stage. The impedance matching stage is coupled to the feedback circuit wherein the feedback circuit provides a compensated second bias voltage for the impedance matching stage. The output of the impedance matching stage is used to set an input bias voltage for both the impedance matching stage and the gain stage. The output of the impedance matching stage is also used, together with the output of the gain stage, to produce an output of the amplifier. A signal reuse stage may be provided between the output of the impedance matching stage and the output of the amplifier.

25 Claims, 7 Drawing Sheets

U.S. PATENT DOCUMENTS

| | | | |
|---|---|---|---|
| 7,474,158 B1 | 1/2009 | Yim et al. | |
| 7,495,515 B1 | 2/2009 | Branch et al. | |
| 7,595,693 B2 | 9/2009 | Wiklund | |
| 7,622,989 B2 | 11/2009 | Tzeng et al. | |
| 7,633,345 B2 | 12/2009 | Zhan | |
| 7,656,229 B2 | 2/2010 | Deng et al. | |
| 7,679,436 B2 | 3/2010 | Jimenez et al. | |
| 7,714,657 B2 | 5/2010 | Wu | |
| 7,843,270 B2 | 11/2010 | Li et al. | |
| 2005/0068106 A1 | 3/2005 | Irvine | |
| 2006/0132242 A1 | 6/2006 | Han et al. | |
| 2008/0157876 A1 | 7/2008 | Tsuyoshi et al. | |
| 2009/0085668 A1 | 4/2009 | Gao et al. | |
| 2009/0140812 A1 | 6/2009 | Deng et al. | |
| 2010/0237947 A1 | 9/2010 | Xiong et al. | |
| 2010/0321113 A1 | 12/2010 | Kathiresan et al. | |
| 2010/0328542 A1 | 12/2010 | Kammula et al. | |
| 2011/0003563 A1 | 1/2011 | Gorbachov | |
| 2011/0018635 A1 | 1/2011 | Tasic et al. | |

FOREIGN PATENT DOCUMENTS

| | | |
|---|---|---|
| EP | 1 993 201 A1 | 11/2008 |
| JP | 2010087954 A | 4/2010 |
| KR | 101019716 B1 | 7/2010 |
| KR | 20100077726 A | 7/2010 |
| WO | WO 2007/085866 A1 | 8/2007 |

OTHER PUBLICATIONS

Communication entitled "Patents Act of 1977: Entitlement to earlier date under Section 15(9)", dated Aug. 20, 2012, issued by the U.K. Patent Office in related U.K. Application No. GB1207237.7 (2 pages).

Che-Sheng Chen, et al., "A 2.5GHz 90nm CMOS Triple Gain Mode LNA for WiMAX Applications," International Symposium on Signals, Systems and Electronics, ISSSE' 07, pp. 367-369 (3 pages).

Hsieh-Hung Hsieh et al., "Design of Ultra-Low-Voltage RF Frontends with Complementary Current-Reused Architectures," IEEE Transactions on Microwave Theory and Techniques, IEE Service Center, Piscataway, NJ, USA, vol. 49, No. 7, Jul. 1, 2007, pp. 1445-1458, XP011187189.

PCT International Search Report and Written Opinion mailed Aug. 31, 2012 issued in a related PCT international application No. PCT/IB2012/052498 (16 pages).

Bruccoleri, et al., "Wide-Band CMOS Low-Noise Amplifier Exploiting Thermal Noise Cancelling", IEEE Journal of Solid-State Circuits, vol. 39, No. 2, Feb. 2004, pp. 275-282.

EP Combined Search and Examination Report under Sections 17 and 18(3) issued for corresponding GB Patent Application No. GB1117607.0 mailed Jan. 27, 2012. (6 pages).

EP Combined Search and Examination Report under Sections 17 and 18(3) issued for corresponding GB Patent Application No. GB1117608.8 mailed Feb. 8, 2012. (8 pages).

Notice of References Cited issued Jun. 18, 2012 in connection with a related U.S. Appl. No. 13/271,566.

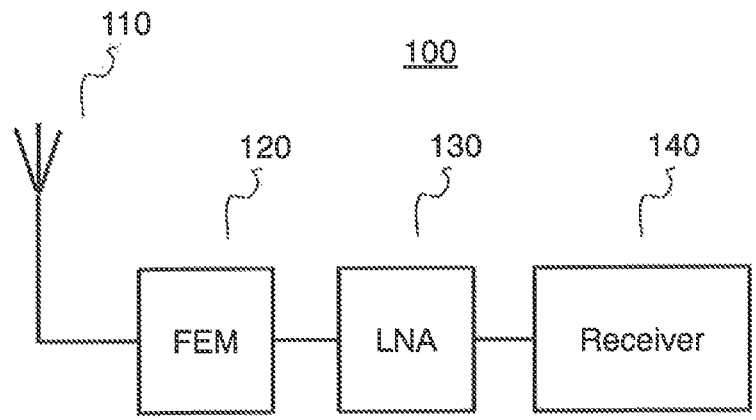
Figure 1
PRIOR ART
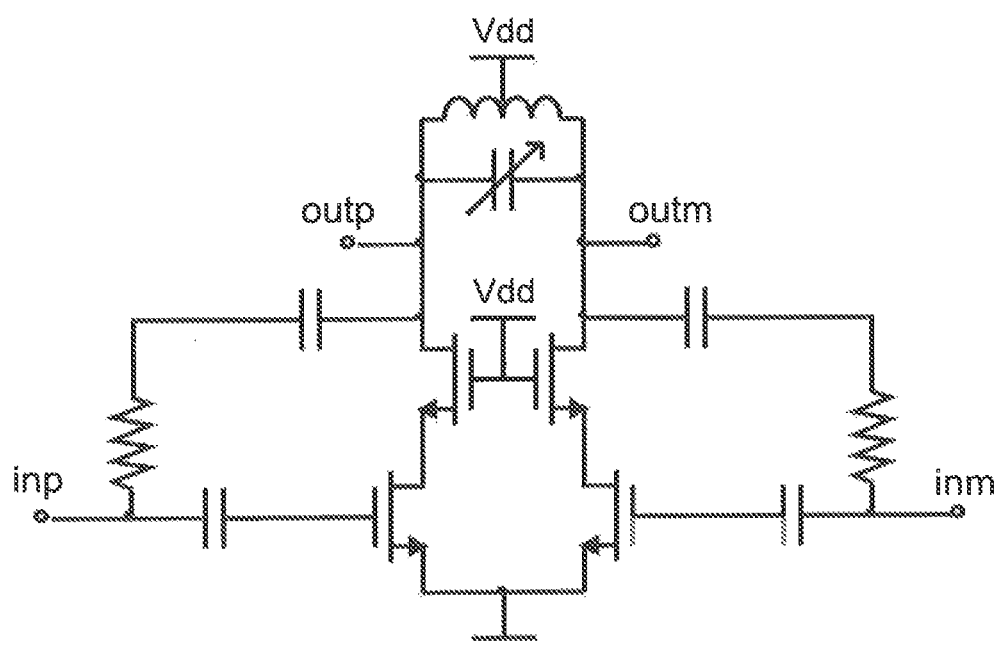
Figure 2 – Comparative Example
PRIOR ART

APPARATUS AND METHOD FOR LOW NOISE AMPLIFICATION

CROSS-REFERENCE TO RELATED APPLICATIONS

This is a Continuation of U.S. patent application Ser. No. 13/224,430, filed Sep. 2, 2011, and claims benefit under 35 U.S.C. 119 of UK 1115183.4, filed Sep. 2, 2011, the entire disclosure of each of which is incorporated herein by reference.

TECHNICAL FIELD

The present invention relates to an amplifier. In particular, but not exclusively, the present invention relates to a low noise amplifier and the manufacture and use thereof. An amplifier produced according to the present invention is suitable for use as a low noise amplifier in a radio-frequency communications system.

BACKGROUND

A low noise amplifier (LNA) is commonly the first amplifying stage in a radio frequency receiver. The LNA is typically arranged to amplify a received signal to an amplitude suitable for further processing and decoding. To illustrate typical uses of an LNA two examples will be described with reference to FIGS. 1 and 9.

As illustrated in the simplified communications system 100 of FIG. 1, an LNA 130 receives a potentially weak signal captured by an antenna 110 and amplifies it for subsequent use in a receiver system 140. In some implementations an LNA may receive a signal directly from an antenna; in other implementations a front-end module (FEM) 120 may be provided. An FEM may comprise, amongst others, one or more filters, switch elements, duplexers and diplexers. Upstream components are those to the left of the LNA in FIG. 1 (e.g. FEM 120) and downstream components are those to the right of the LNA in FIG. 1 (e.g. receiver 140).

FIG. 9 illustrates a schematic diagram of an exemplary Direct Conversion Receiver (DCR) as known in the art. The DCR makes use of a LNA to amplify a received signal. In the example of FIG. 9, a wide range of radio communication signals are received at antenna 900, which is tuned by a wide bandwidth pre-selection filter 902. The filtering behaviour of pre-selection filter 902 may arise out of the physical and electromagnetic characteristics of the antenna design, perhaps due to optimisation for the frequency band of the desired telecommunication application. Pre-selection filter 902 may also include one or more tuned circuits, which are used to remove frequency components of the input that are far outside the intended range of reception frequencies. The received signal is typically of very small amplitude, and requires amplification by LNA 904 before further processing can be performed. In this example, LNA 904 must operate at high frequencies (at least the transmission frequency of the signal the receiver is intended to receive), commonly referred to as radio frequency, and also provide very low noise insertion due to the weakness of the incoming signal.

In order to select the appropriate signal from the many signals received at antenna 900, the received input must be filtered. However, the high selectivity of the filter profile that would be required to isolate one signal at radio frequency makes filtering at this stage either unrealistic (given the manufacturing tolerances of commonly available components) or undesirably expensive. Hence, before signal selection can occur, the frequency of the desired signal must be down-converted by mixing the input signal with a signal generated by local oscillator 906. A direct conversion receiver converts the desired signal directly to baseband frequency by mixing it with a local oscillator signal of the same frequency as the carrier frequency of the desired signal. This has the effect of translating the desired signal to be centred on zero frequency.

In order to extract both the I and Q components, the input signal must be mixed with both in-phase and quadrature shifted versions of the local oscillator signal, which are generated by quadrature generator 908. The exact phase of the received signal cannot be predicted due to the unknown phase shift that will occur during transmission. Hence, the local oscillator must synchronise with the received signal in order to ensure the necessary phase relationship. This synchronisation may be achieved by establishing a phase reference, for example by using a phase locked loop (PLL) or by rotating the signal after down-conversion by digital means. The input signal is mixed with the in-phase local oscillator signal by mixer 910, and with the quadrature phase local oscillator signal by mixer 912. Mixers 910 and 912 perform multiplication between the input signal and the appropriate local oscillator signal in order to achieve the required frequency down-conversion.

The desired I and Q components can then be isolated using low pass filters 914 and 916 respectively, which are used to suppress unwanted frequencies associated with signals adjacent in adjacent channels etc. Finally, analogue to digital converters (A/Ds) 918 and 920 convert the I and Q components into binary representations of the I and Q message data 922 and 924. Once in the digital domain, further processing can be performed on the I and Q data, including recombination of the components to form the original data message. The original data message can then be used by the receiving device. As with FIG. 1, upstream components are those to the left of the LNA in FIG. 9 (e.g. pre-selection filter 902) and downstream components are those to the right of the LNA in FIG. 9 (e.g. mixers 910 and 912).

In certain implementations of the DCR of FIG. 9, components 904 to 924 form part of a Radio Frequency Integrated Circuit (RFIC) 950. In these cases, the design of the LNA must be suitable for RFIC manufacturing and preferably take up a minimal silicon die area.

As demonstrated by the previous examples, most modern communications systems comprise a plurality of processing components for receiving signals. Each processing component will contribute to the degradation of a signal-to-noise (SNR) ratio of the signal received from the antenna. Friis' equation provides a formula for calculating a total noise factor for a communications system:

$$F_{total} = F_1 + (F_2-1)/G_1 + (F_3-1)/G_1 G_2 + \ldots + (F_n-1)/G_1 G_2 \ldots G_{n-1}$$

wherein $F_n$ and $G_n$ are respectively the noise factor and power gain of an nth component in a cascade of input stages, the noise factor being the ratio of the SNR into a component and the SNR out of a component. Reference may be also made to a noise figure, which is a noise factor expressed in decibels. If the LNA is the first amplifying stage of the communications system, then according to Friis' equation, the LNA sets the minimum noise factor of the system, i.e. $F_1 = F_{LNA}$. Hence, it is important that the LNA has a low noise factor, i.e. that the amount of noise introduced by the LNA is minimised.

The noise factor of a LNA can also affect the design of large-scale telecommunications systems. For example, a telecommunications system may comprise a number of electronic devices that communicate with a fixed network using wireless communications. As the LNA typically sets the minimum noise factor of a receiving device in a telecommunications system, the noise factor of the LNA influences the sensitivity of these electronic devices to wireless signals. If the noise factor is high, the sensitivity decreases accordingly. This shortens the range of an electronic device thus making the design of the telecommunications network more challenging and more expensive. For example, the noise factor of an LNA implemented in a number of electronic devices can influence the number of base stations that are needed; more base stations being needed if the noise factor is high.

Radio frequency receivers can be configured to operate within a number of different radio frequency bands. For example a receiver for a mobile station (or cellular telephony device) can be configured to operate within any of the following bands: Global System for Mobile Communications (GSM), 850, 900, 1800, and/or 1900, Wideband Code Division Multiple Access (WCDMA), High Speed Packet Access (HSPA) and/or Long Term Evolution (LTE) Bands 1, 2, 3, etc. This allows a mobile station containing such a receiver to be used in different areas where varying subsets of the above radio frequency bands are supported (e.g. to enable roaming). However, this requires processing stages capable of operating across a wide band of frequencies. In particular, this either requires multiple low-cost LNAs for amplifying a plurality of frequency bands or wideband LNAs.

There is thus a need in the art for an LNA with a low noise factor. For implementation in mobile devices an LNA should have a small overall size. An LNA should also have a low cost, low current consumption and be suitable for high volume manufacturing. Hence, in order to design a competitive LNA, there are typically several figures-of-merit to be fulfilled, wherein several of the requirements for an LNA are difficult to achieve simultaneously.

SUMMARY

In one exemplary embodiment, there is provided an amplifier comprising an impedance matching stage coupled to an input of the amplifier, the output of the impedance matching stage providing an input bias voltage for the impedance matching stage, a feedback circuit coupled to an output of the impedance matching stage and a first voltage source, the feedback circuit providing a compensated second bias voltage for the impedance matching stage, and a gain stage coupled to the input of the amplifier, the output of the impedance matching stage providing an input bias voltage for the gain stage, wherein an output of the gain stage and an output of the impedance matching stage are used to produce an output of the amplifier.

In another exemplary embodiment, there is provided a method for amplifying a signal comprising inputting the signal to an impedance matching stage, feeding back an output of the impedance matching stage to an input of the impedance matching stage so as to provide an input bias voltage, feeding an output of the impedance matching stage through a feedback circuit comprising an amplifier circuit to set a compensated second bias voltage for the impedance matching stage, inputting the signal in parallel to a first gain stage to produce a first current output, using the output of the impedance matching stage to provide a second current output, combining the first and second current outputs to produce a third current output; and providing an output of the amplifier based on the third current output.

In another exemplary embodiment, there is provided a method of manufacturing an amplifier comprising providing an impedance matching stage coupled to an input of the amplifier, including coupling an output of the impedance matching stage to provide an input bias voltage for the impedance matching stage, providing a feedback circuit coupled to an output of the impedance matching stage and a voltage source, including arranging the feedback circuit to provide a compensated second bias voltage for the impedance matching stage, providing a first gain stage coupled to the input of the amplifier, including arranging the output of the impedance matching stage to provide an input bias voltage for the gain stage, providing an output of the amplifier based on the output of the impedance matching stage and an output of the gain stage.

Further features and advantages of the invention will become apparent from the following description of preferred embodiments of the invention, given by way of example only, which is made with reference to the accompanying drawings.

BRIEF DESCRIPTION OF THE DRAWINGS

FIG. 1 is a simplified schematic diagram showing components of a radio frequency receiver;

FIG. 2 is a simplified circuit schematic diagram showing a comparative example of an LNA;

DETAILED DESCRIPTION

Figure 3:
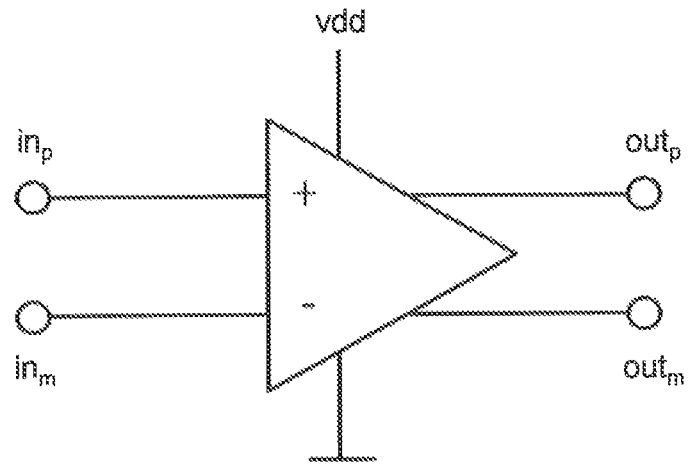
FIG. 3 is a schematic diagram showing the inputs and outputs of a differential low noise amplifier.

In one exemplary embodiment, described below, there is provided an amplifier comprising an impedance matching stage coupled to an input of the amplifier, the output of the impedance matching stage providing an input bias voltage for the impedance matching stage, a feedback circuit coupled to an output of the impedance matching stage and a first voltage source, the feedback circuit providing a compensated second bias voltage for the impedance matching stage, and a gain stage coupled to the input of the amplifier, the output of the impedance matching stage providing an input bias voltage for the gain stage, wherein an output of the gain stage and an output of the impedance matching stage are used to produce an output of the amplifier.

By using an output, such as a voltage output, of the impedance matching stage to bias the inputs of the impedance matching stage and the gain stage, a bias can be provided without alternating current (AC)-coupling capacitors and/or bias resistors. This can thus reduce the cost and/or size of an LNA and improves the noise factor performance of an LNA. This arrangement provides a first level of feedback from the output of the impedance matching stage to the input of the impedance matching stage. A second level of feedback may also be provided using a feedback circuit, wherein the output of the feedback circuit is used to set the compensated second bias voltage of the impedance matching stage based on a first voltage source and an output of the impedance matching circuit. This has the effect of compensating the second bias voltage for the impedance matching circuit for at least one of temperature, process, corner, and aging effects resulting in more robust performance. As such the amplifier is particularly suited to mass production. The output of the impedance matching stage may also be used to contribute to the output of the amplifier. For example, a link or coupling stage may be coupled to the output of the impedance matching stage to link or couple a current signal produced by the impedance matching stage to the output of the amplifier, while still maintaining the impedance matching functionality. The output of this link or coupling stage may then be combined with the output of the gain stage to produce a combined current signal that, with possible further processing, eventually becomes the output of the amplifier. This reduces current consumption by "reusing" a signal amplified by the impedance matching stage and also improves noise performance.

The features described above efficiently utilise the output of the impedance matching stage to produce an improved amplifier. As the features use the output of the impedance matching stage, they operate synergistically: for example, the operating characteristics of the impedance matching stage are set based on feedback from the output of said stage which leads to improved and stable operation that allows an alternating current signal from said stage to be used to contribute to the output of the amplifier. If operating conditions change this is reflected in the output of the impedance matching stage, thus affecting the input biases of the amplifier and the compensated second bias voltage of the impedance matching stage and in turn the output of the amplifier via the output of the gain stage and the contribution provided by the impedance matching stage.

In certain embodiments, the feedback circuit comprises an amplifier circuit, the output of the impedance matching stage being coupled to an inverting input of the amplifier circuit, the first voltage source being coupled to a non-inverting input of the amplifier circuit and the compensated second bias voltage for the impedance matching stage being set based on the output of the amplifier circuit. An amplifier circuit provides an efficient implementation of the feedback circuit that maintains the cost and size benefits of the amplifier.

In certain embodiments, the impedance matching stage comprises a feedback resistor coupled to the input of the amplifier and a first node, a load component coupled to an output of the feedback circuit and the first node, and a first NMOS transistor having a source, a gate and a drain, the gate being coupled to the input of the amplifier, the drain being coupled to the first node, the first node providing the output of the impedance matching stage.

This arrangement provides an efficient implementation of the impedance matching stage. The feedback resistor provides a first level of feedback for setting the input bias voltages of the impedances matching and gain stages. The combined impedance of the feedback resistor, the load component and the first NMOS transistor matches the input impedance of the amplifier to desired source impedance. This arrangement may be implemented internally in an integrated LNA as it does not require components that occupy large silicon die area. No external matching components are required. This makes such an LNA particularly suited to mass production and use in wideband systems.

In certain embodiments, the load component comprises a first PMOS transistor having a source, a gate and a drain, the gate being coupled to the output of the feedback circuit to provide the compensated second bias voltage for the impedance matching stage, the drain being coupled to the first node. A first PMOS transistor is an efficient implementation of an operating voltage input of the impedance matching stage as by changing a gate bias voltage for the transistor via the feedback circuit, a NMOS/PMOS ratio can be kept constant across different temperature, ageing and process effects, providing a robust solution. The output of the feedback circuit may be coupled to the gate of the first PMOS transistor via a first resistor and the input of the feedback circuit may be coupled to the first node via a second resistor. These may be large value resistors which act to provide voltages for biasing the gate of the PMOS transistor and for an input to the feedback circuit.

In certain embodiments, the gate of the first PMOS transistor is coupled to the input of the amplifier via a first AC-coupling capacitor. This acts to isolate a DC bias voltage for the PMOS transistor from any voltage at the input, but acts to allow AC currents to pass thus enabling the impedance matching stage to amplify an AC signal that may contribute to the output of the amplifier.

In certain embodiments, the transconductances of the first PMOS transistor and the first NMOS transistor and the resistance of the feedback resistor are selected to match a desired source impedance.

In certain embodiments, the gain stage comprises a second NMOS transistor having a source, a gate and a drain, the gate being coupled to the input of the amplifier, the drain comprising the output of the gain stage. Such an arrangement efficiently provides a high gain stage that requires no AC-coupling or bias resistors.

In certain embodiments, a signal coupling stage is coupled to the output of the impedance matching stage, an output of the signal coupling stage being used together with the output of the gain stage to produce an output of the amplifier. In this arrangement the output of the impedance matching stage, for example an AC signal, is processed before contributing to the output of the amplifier. In some embodiments, the signal coupling stage comprises a third NMOS transistor having a source, a gate and a drain, the gate being coupled to the output of the impedance matching stage, the source being coupled to the output of the gain stage. As such, the output of the impedance matching stage is amplified before being constructively added to the output of the gain stage, increasing the performance of the amplifier. In some embodiments, the gate of the third NMOS transistor is coupled to a second voltage source via a third resistor to bias the gate, the gate being coupled to the output of the impedance matching stage via a second AC-coupling capacitor. This provides an efficient arrangement and the AC-coupling capacitor isolates the DC gate bias voltage from the voltage at the first node.

In certain embodiments, the amplifier comprises one or more current cascodes located before the output of the amplifier. These allow a current signal to be buffered before being output by the amplifier. In some embodiments, the first current cascode comprises a fourth NMOS transistor having a source, a gate and a drain, the source being coupled to at least the output of the gain stage. A second current cascode may also be coupled to the first current cascode between the drain of the fourth NMOS transistor and the output of the amplifier. One or more current cascodes enable gain control to be easily added to the amplifier.

In certain embodiments, the amplifier comprises a differential amplifier, said stages forming part of one differential circuit of a differential circuit pair. Certain embodiments are particularly suited to implementations that use differential signals, such as low noise amplifiers in radio-frequency communications systems. In these cases, one of a configurable load or an LC resonator may be coupled between respective outputs of each differential circuit. For example, an LC resonator comprising an inductor with mutual coupling, such as a centre-tap differential inductor with mutual coupling, rejects common-mode signals.

By amplifying a signal according to one of the exemplary methods described above, current consumption is reduced by "reusing" the output of the impedance matching stage to produce a current output of the amplifier. Feeding back the output of the impedance matching stage so as to provide a bias point for the impedance matching stage ensures the robustness of the amplifier.

In some embodiments, the method of manufacturing an amplifier comprises providing an amplifier circuit to implement the feedback circuit, including coupling the output of the impedance matching stage to an inverting input of the amplifier circuit, coupling the voltage source to a non-inverting input of the amplifier circuit and setting an operating bias voltage for the impedance matching stage based on the output of the amplifier circuit and providing an output of the amplifier comprises providing a second gain stage between the output of the impedance matching circuit and the output of the amplifier such that the output of the amplifier is based on the output of the first gain stage and the output of the second gain stage. In the example described herein the amplifier may provide amplification. It acts to compensate for operating conditions in use and/or variations in the manufacturing method.

Certain exemplary embodiments of this disclosure present an LNA topology that enables impedance matching with a preceding receiver stage without external components. This provides a cost-efficient solution. Certain exemplary embodiments of this disclosure achieve high gain and therefore reduce the noise contribution of processing stages following an LNA. This can be seen when applying Friis' equation above: the noise factors for subsequent components are divided by the power gain of a preceding LNA. Certain exemplary embodiments of differential LNA provide good input impedance matching over a wide bandwidth for differential as well as for common-mode signals, which in turn results in good common-mode linearity. An LNA according to some embodiments has compensation for temperature, process, corner, and aging effects and offers no restrictions when choosing an interface to mixer and analogue baseband components. In some configurations, the LNA removes the need for direct current (DC)-coupling capacitors for input transistor devices, which leads to a smaller die area being used when compared to prior art LNAs.

The LNA as presented in certain embodiments of the disclosure may be used, amongst other implementations, in wireless devices. "Wireless devices", as used herein, includes in general any device capable of connecting wirelessly to a network, and includes in particular mobile devices including mobile or cell phones (including so-called "smart phones"), personal digital assistants, pagers, tablet and laptop computers, content-consumption or generation devices (for music and/or video for example), etc., as well as fixed or more static devices, such as personal computers, game consoles and other generally static entertainment devices, various other domestic and non-domestic machines and devices, etc. The LNA as presented in certain embodiments of the disclosure may also be used in any radio-frequency receiver, including those provided in network equipment such as network base stations, wireless routers, wireless sensors, wireless monitoring hardware or any device that communicates using a radio frequency connection. For example, the LNA may operate with wireless systems using any of the frequency bands and/or protocols described above.

In order to demonstrate the features of an embodiment of the disclosure a comparative example will be first described. Reference will also be made to some of the problems encountered with this comparative example which are solved by certain embodiments of the disclosure.

FIG. 2 shows an LNA that is described by C.-F. Liao and S.-I. Liu in "A broadband noise-cancelling CMOS LNA for 3.1—10.6-GHz UWB receivers," IEEE J. of Solid-State Circuits, vol. 42, no. 2, February 2007, pp. 329-339. This LNA uses a shunt-resistor topology to feedback a portion of the amplified output in each differential circuit. The design is an alternative to an inductively degenerated (Ldeg) common-source amplifier topology. Known inductively degenerated common-source amplifier topologies are typically able to provide a suitable noise figure, with useful current and voltage gain. These properties are investigated, for example, in D. K. Shaeffer and T. H. Lee, "A 1.5-V, 1.5-GHz CMOS low noise amplifier," *IEEE J. of Solid-State Circuits*, vol. 32, no. 5, May 1997, pp. 745-759.

In a communications system, an LNA determines the input impedance of radio-frequency (RF) integrated circuits (ICs) implementing the input stages of the system. Sufficient input matching performance is required because the performance of any radio frequency filter stages preceding the LNA will degrade if the input impedance of the LNA is not properly matched to output impedance of said stages. In some implementations a preceding stage may simply comprise an antenna; in other implementations, said stages may comprise one or more processing components. In some implementations, one or more RF filters may be provided with different fixed or tuneable centre frequency ranges. For example, this is common in wideband systems. In these implementations, any impedance matching must also occur across the complete range of specific frequencies. Known inductively degenerated common-source amplifier topologies typically do not provide any impedance matching internally within the LNA. This is because the size and quality of the passive components required to provide internal matching would make it technically and economically impractical to provide such components as part of the LNA. For example, high quality inductors require a larger silicon die area, and so would be impractical to include in an integrated LNA for a mobile device. This is especially true when then there are several LNAs inside a single RFIC. These topologies thus typically use external impedance matching components, i.e. components provided separately to an integrated circuit implementing the LNA, to match input impedance. For example, often an inductor is used as an external impedance matching coupled to each of the differential inputs. One challenge is to achieve good noise performance without external matching components and with sufficient current consumption for mobile devices. The cost of a radio frequency receiver comprises the cost of a silicon area for receiver ICs, the cost of any external matching components and the cost of any printed wiring board (PWB) area. If there are multiple RFIC inputs, as for example is the case in wideband receivers, the count of the external matching components can become high thus increasing the expense of the radio frequency receiver. For example, some receivers may use multiple LNAs, each receiving a different band of frequencies; any external component costs and silicon area requirements are increased. In addition, the number of on-chip inductors should be kept at minimum to reduce costs.

In the comparative example of FIG. 2, a resistor provides feedback from each output node of the LNA to the gate connection of each input transistor. The resistance of the resistor, together with the transconductance of the input transistor, can be matched to the impedance seen by each input terminal of the LNA. Hence, the comparative example of FIG. 2 provides internal impedance matching. However, this topology requires high output impedance and therefore a high Q-value load inductor is required. If an inductor is used $Q=(\omega L)/R$, wherein $\omega$ equals the angular resonant frequency, i.e. $2*\pi*f$ (f=frequency of current signal), the Q-value representing the ratio of inductor impedance at a certain frequency versus resistive losses. The high output impedance also requires special attention to the interface design with downstream processing components such as conversion mixers and analogue baseband components.

A further problem with the topology shown in FIG. 2 is that the high differential linearity is not valid for common-mode signals, i.e. has poor common-mode linearity. A differential amplifier amplifies the difference between two input signals applied to its input terminals. In FIG. 2 the input terminals are labelled inp (input "p") and inm (input "m"). Typically, a differential signal applied to input terminal inm is a signal having the same magnitude as the signal applied to input terminal inp but being 180 degrees out of phase with that signal (i.e. the differential signals have opposite phase). Comparatively, common mode signals differ from differential signals in that they have the same phase and amplitude at both input terminals. An amplifier with high differential linearity has a constant relationship between the input and the output for differential signals across a given input range, for example if the input changes by a set amount the output changes by a corresponding set amount, the ratio between input and output changes being constant. Likewise, an amplifier with poor common-mode linearity may produce a non-linear relationship between an applied common-mode input and the output.

Interfering signals may comprise common-mode and/or differential signals. Interfering signals may be referred to as "blocker" signals as they block the received signal. In an RF receiver, common-mode and/or differential blocker signals may be generated by an antenna port and/or a transmitter port. For example, in frequency division duplex systems there may be transmitter leakage from a transmitter port that generates common-mode and/or differential blocker signals. Blocking signals can also be provided by, amongst others, other transmitting systems, wireless local area networking (WLAN) components or Bluetooth systems. If any front-end modules such as duplex or RF filters are provided between an antenna and an LNA, these are commonly designed to attenuate differential signals, for example as required by a standards specification. However, there is typically no assured attenuation for common-mode blocker signals in front-end modules such as duplex or RF filters. In amplifiers that comprise a resonator load with differential inductor, such as an LC resonator with a centre-tap differential inductor device with mutual coupling, a resonator impedance is different for common mode and differential signals. Therefore the resonator load is able to reject signal components common to both input signals whilst amplifying the difference between the two signals. That is due to the mutual coupling in the load inductor. If there is a good common mode linearity at the LNA input stage (prior to the resonator load), the reception of a wanted signal, for example a communicated data signal, will not be disturbed by the common mode blocker signals. Furthermore, common mode blockers are rejected at the output resonator in order not to cause problems in the following blocks of the receiver system.

However, if the amplifier has poor common-mode linearity, these common-mode signals are not rejected impairing the functioning of the LNA.

Another problem with the comparative example of FIG. 2 is that the noise performance is worse than that of the inductively degenerated common-source amplifier topologies. For example, as there is no passive voltage gain prior to each LNA input stage, as for example may be provided by an off-chip inductor in an inductively degenerated common-source amplifier topology, the noise effect of each input transistor is not mitigated. Even with an inductively degenerated common-source amplifier topology with passive voltage gain, the noise performance is dependent on the input transistor noise performance. In addition, with the example of FIG. 2, due to the feedback, there are additional noise sources. Furthermore, as resistive feedback LNAs lack the passive voltage gain provided by off-chip inductors, higher current consumption is required in order achieve noise and gain performance equal to Ldeg topologies.

However, shunt resistor feedback LNAs do not require external matching components. This makes them attractive for use in wideband receivers where many LNAs may be needed to cover a number of different frequency bands. For these reasons, shunt resistor feedback LNAs are generally preferred to inductively degenerated LNAs.

There have been attempts to reduce the noise effects in LNAs. One example is a noise cancelling LNA given in F. Bruccoleri, E. A. M. Klumperink, and B. Nauta, "Wide-Band CMOS Low-Noise Amplifier Exploiting Thermal Noise Cancelling," IEEE J. of Solid-State Circuits, vol. 39, no. 2, February 2004, pp. 275-282. This provides some degree of internal impedance matching, wherein a further stage is provided to reduce the noise of an impedance matching stage. However, this design does not feature an LC-resonator at the LNA load which makes it difficult to achieve a high voltage gain. A high voltage gain is required to suppress the noise figure of other components and stages within the design. In addition, the impedance matching components feature an NMOS (N-channel metal-oxide-semiconductor field-effect transistor, NMOS being shorthand for N-MOSFET) and a PMOS (P-channel metal-oxide-semiconductor field-effect transistor, PMOS being shorthand for P-MOSFET). The ratio of the PMOS to NMOS transistor transconductances (gm), i.e. the PMOS/NMOS ratio, sets various circuit properties. In this design, corner (i.e. manufacturing process) and aging variations of the transistors will affect the operation of the LNA.

Certain embodiments of the disclosure provide an LNA that addresses at least some of the problems of at least some of the LNA topologies described above.

FIG. 3 shows a high-level schematic illustration of an LNA according to an embodiment of the disclosure. The LNA of FIG. 3 is an integrated differential low noise amplifier and as such has two inputs: $in_p$ and $in_m$. For most differential signals, a signal p applied to $in_p$ will be 180 degrees out of phase with (i.e. of opposite phase to) a signal m applied to $in_m$. The LNA of FIG. 3 has two outputs, one for each differential signal: $out_p$ and $out_m$. In some implementations the two outputs may be connected to provide a single output. The LNA of FIG. 3 is powered by a voltage supply vdd and is connected to ground. The voltage supply supplies a DC voltage. Even though a present embodiment will be described with regard to a differential amplifier, the features of the present embodiment may also be applied to amplifiers for single-ended signals.

A differential amplifier typically has two topology portions, one for a first differential signal, e.g. p, and one for a second differential signal, e.g. m. These topology portions will be referred to herein as differential circuits, wherein a first differential circuit typically relates to the positive or 'plus' side of the differential amplifier and a second differential circuit relates to the negative or 'minus' side of the differential amplifier. Each differential circuit will have a corresponding input and output, e.g. for a signal p a first differential circuit will have input $in_p$ and output $out_p$, likewise for a signal m a second differential circuit will have input $in_m$ and output $out_m$. In some topologies the differential circuits are coupled at the outputs, for example via a configurable load such as a centre-tap differential inductor device with mutual coupling. In single-ended embodiments, only the features of one of the differential circuits may be supplied.

Figure 4:
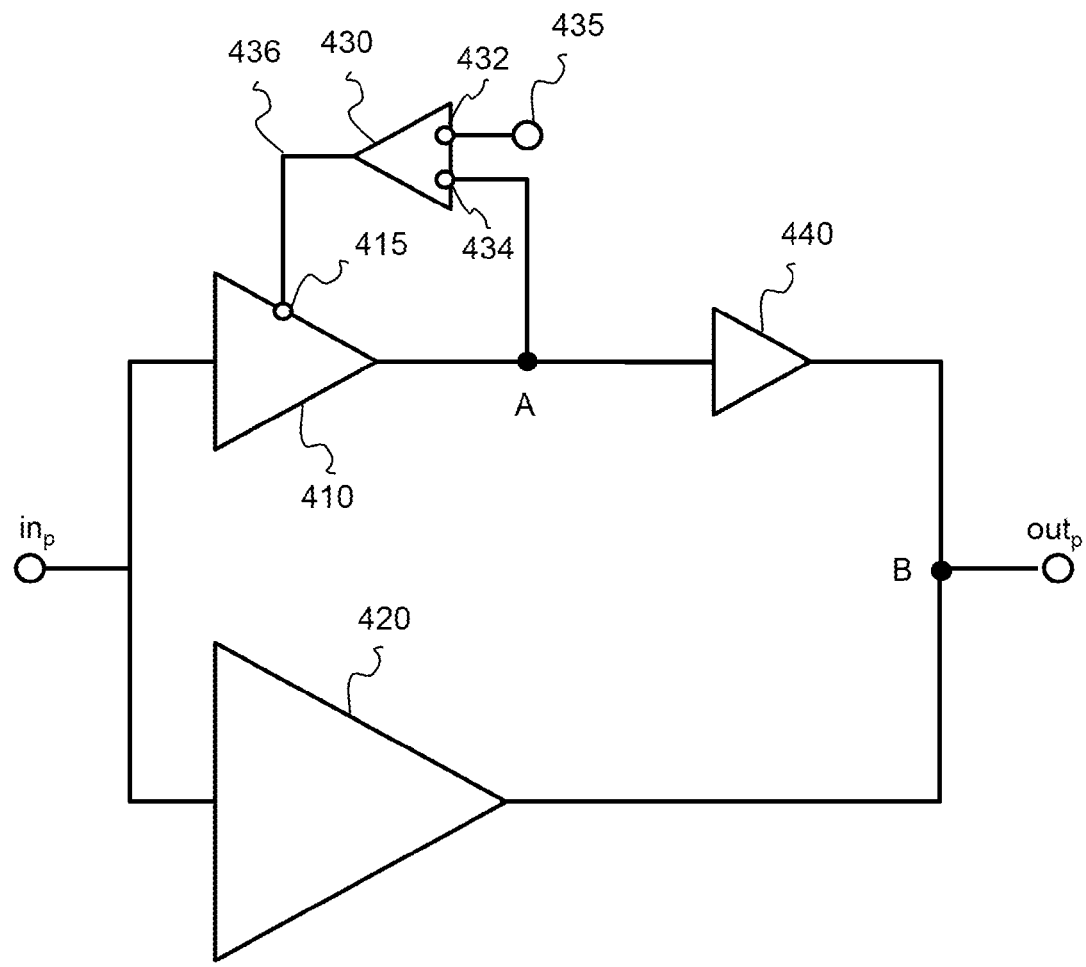
FIG. 4 is a simplified schematic diagram of a number of stages that form one portion of a low noise amplifier according to embodiments of the disclosure.

FIG. 4 shows a schematic illustration of one or more stages in one of the differential circuits of an LNA according to an embodiment of the disclosure. Certain features of the differential circuit are omitted, such as a coupling to a further differential circuit and ground, to better demonstrate the conceptual aspects of the embodiment. The terms "couple" and "electrically couple" refer to a direct or indirect electrical connection between two components. If a first component is coupled to a second component this may be through a direct connection, e.g. an electrical trace or wire, or via one or more further components, e.g. one or more components or stages may be provided upon an electrical trace between the first and second components.

The stages shown in FIG. 4 have a signal p applied at input $in_p$. The input is coupled to an impedance matching stage 410. The impedance matching stage 410 acts to match an input impedance seen at the input $in_p$. For example, one or more components of the impedance matching stage 410 may have a combined impedance that matches any impedance of receiver processing stages upstream of the LNA such as a front-end module, RF filter or duplex filter.

The input $in_p$ is further electrically coupled to a gain stage 420, i.e. the impedance matching stage 410 and the gain stage 420 are both coupled in parallel to the input $in_p$. Having a gain stage 420 in parallel with the impedance matching stage 410 increases the gain of the LNA. As approximately illustrated by the relative size of the stages in FIG. 4, the gain of the gain stage 420 is greater than any gain provided by the impedance matching stage 410. Gain stage 420 is coupled to the output $out_p$.

The output of the impedance matching stage 410 (node A) is coupled to a feedback circuit 430. The output of the impedance matching stage 410 also contributes to the output $out_p$ of the system, in the present example, via a second gain, signal processing or signal reuse stage 440. In other embodiments, the impedance matching stage 410 may be coupled to the output $out_p$ without signal reuse stage 440, for example via other components that maintain a high impedance at node A, such that the LNA still provides adequate impedance matching. In the example of FIG. 4, the outputs of the signal reuse stage 440 and the gain stage 420 are combined to produce output $out_p$. This may be achieved by coupling the outputs of both stages at node B so that two output current signals are constructively combined. In some embodiments, both the gain stage 420 and the signal reuse stage share the same DC current path thus optimising the current consumption of the LNA.

By coupling the output of the impedance matching stage 410 to the output $out_p$, e.g. via signal reuse stage 440, it may be said that the result of the impedance matching stage 410 is "reused", i.e. is subsequently used to produce the output of the amplifier, in the present example via a further gain stage. For example, the impedance matching functionality of the impedance matching stage 410 could be provided without electrically coupling the impedance matching stage 410 to the output $out_p$, e.g. without any coupling between node A and node B. In certain embodiments, the reuse of a signal that has been processed, and in some cases amplified, by the impedance matching stage 410 decreases noise contributions, i.e. contributions to the noise factor, provided by one or more transistors than implement the LNA. For example, amplification provided by the impedance matching stage 410 decreases the noise contribution of following stages in the LNA, e.g. amongst other, current buffer or load stages. In certain embodiments, a current buffer stage (not shown) may be provided before the output, i.e. between node B and output $out_p$. This buffer stage may buffer the current signal from the gain stage 420 and the signal reuse stage 440. In a differential embodiment, the conceptual features of FIG. 4 are typically replicated in a second differential circuit for signal m.

In an embodiment of the disclosure the impedance matching stage 410 uses feedback circuit 430. In the example of FIG. 4, the feedback circuit 430 comprises an amplifier, however other functionally similar feedback arrangements with or without gain may be used in other implementations. In FIG. 4, the output of the impedance matching stage 410, which may comprise a current and voltage at point A, is coupled to an inverting input 434 of the amplifier. One embodiment of this amplifier is shown in more detail in FIG. 5. The non-inverting input 432 of the amplifier is coupled to a voltage source 435, which provides a configurable voltage bias, vbias. The voltage bias vbias may be an internally or externally created bias voltage (from the perspective of an integrated LNA). It may be generated using a resistor and a constant current for example. It may also use a proportional to absolute temperature (PTAT) current or voltage reference to accommodate changes in temperature. The output 436 of the feedback circuit 430 is coupled to a voltage bias 415 for the impedance matching stage 410, i.e. a voltage that is used to set an operating point for the impedance matching stage 410. Hence, the feedback provided by feedback circuit 430, in use and over time, sets the (DC) voltage at node A to the applied voltage bias vbias. For example, this may be achieved in steady state operation. In certain embodiments, the voltage at node A defines a input bias voltage for the impedance matching stage 410 and the gain stage 420 (see the description of FIG. 6 below). This has the advantage of avoiding the use of any AC-coupling capacitors and bias resistors to bias the input voltages of stages 410 and 420, reducing the cost and size of an integrated LNA. The feedback circuit 430 compensates for temperature and corner variations in one or more transistor devices that make up the LNA, such as transistors that implement the impedance matching stage 410. By changing the voltage bias 415 of at least the impedance matching stage 410 the LNA can compensate for corner effects and aging. This in turn provides a more robust solution than that provided by the noise cancelling LNA described above. This is important in mass-produced circuits (i.e. mass produced LNAs) wherein the circuits need to be robust to compensate for variation inherent in the mass production process. The feedback circuit 430 also improves productivity by enabling configuration of the LNA to optimise performance, e.g. by compensating for at least one of corner, temperature, and aging variations that can reduce performance. By using the feedback circuit, an input bias voltage for the impedance matching state 410 and the gain stage 420 can be provided without large value alternating current (AC) coupling capacitors or bias resistors at the input to the LNA. As large value AC coupling capacitors are typically of a large size, this further avoids the need for a large die area. In addition, the lack of bias resistors achieves better noise factor performance in blocking conditions.

Figure 7:
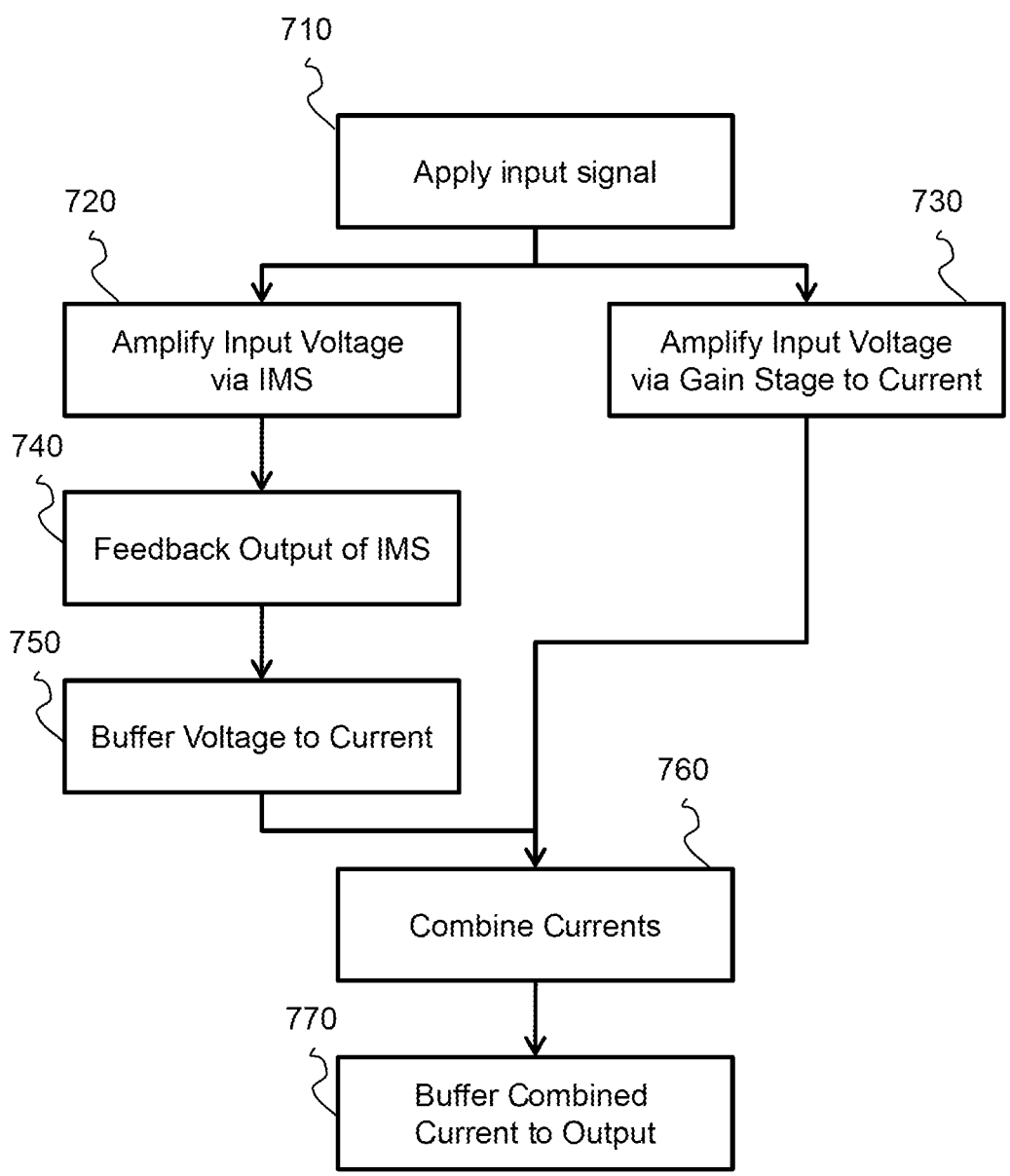
FIG. 7 is a flow chart showing an exemplary method for operating an LNA according to embodiments of the disclosure.

FIG. 7 shows an exemplary method of operating an LNA as, for example, shown in FIG. 4. At step 710 an input signal is applied to an input of the LNA. At step 720 an impedance matching stage (IMS), for example stage 410 of FIG. 4, amplifies a voltage at the input to produce an amplified current. The amplified current creates a voltage signal, for example at node A in FIG. 4, equal to the amplified current times the output impedance of the impedance matching stage. At step 730, in parallel to step 710, the voltage at the input is amplified, for example by gain stage 420 of FIG. 4, to produce an amplified current signal. At step 740, an output of the impedance matching circuit, for example a voltage or current at node A in FIG. 4, is fed back to bias the impedance matching stage, e.g. to provide a bias voltage for an amplifier or components of the impedance matching stage. At step 750, a signal reuse stage may be used to buffer the voltage signal from step 720 to generate an amplified current. At step 760, the amplified currents from steps 730 and 750 are combined, for example at node B in FIG. 4. At step 770, a further current buffering step may be applied before the signal is output from the LNA.

Figure 5:
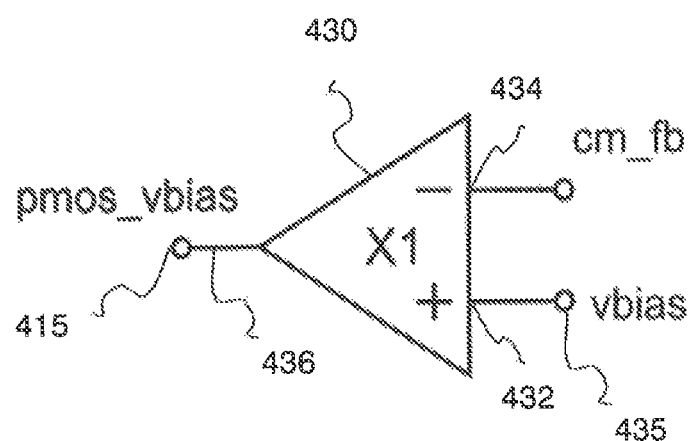
FIG. 5 is a simplified schematic diagram showing a common-mode feedback circuit according to embodiments of the disclosure.
Figure 6:
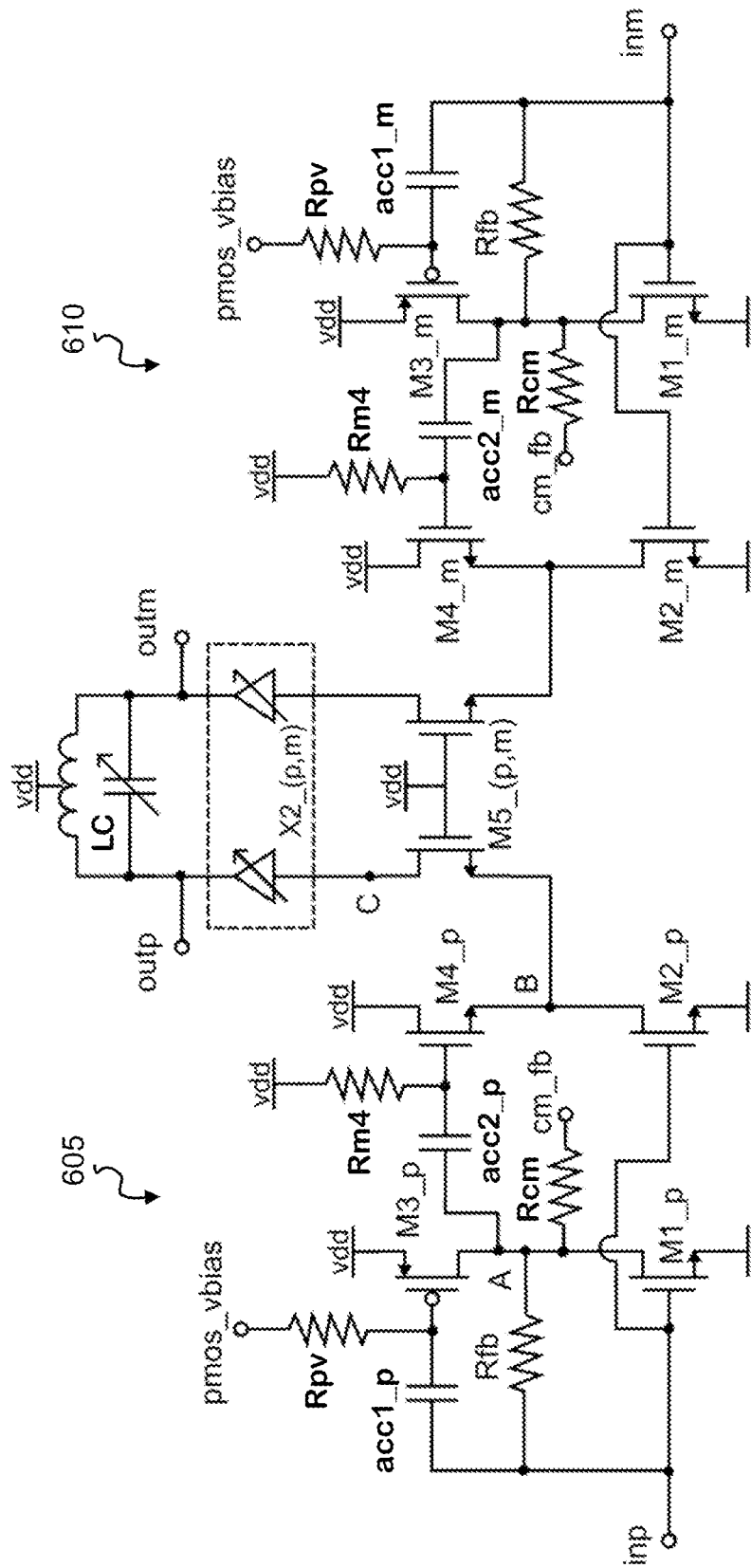
FIG. 6 is a simplified schematic diagram showing an exemplary circuit for implementing a low noise amplifier according to embodiments of the disclosure.

FIG. 5 shows an implementation of feedback circuit 430 that is, for example, suitable for use in the topology of FIG. 6. This implementation uses an amplifier X1 to provide common-mode feedback functionality. When using amplifier X1, a load may be provided that influences the voltage at node A based on a common-mode signal level. Hence, in FIG. 5, the input source for the inverting input 434 is labelled common-mode feedback cm_fb. The non-inverting input 432 of amplifier X1 is coupled to a voltage source, for example source 435 in FIG. 4, which provides the configurable voltage bias, vbias. The output 436 of the feedback circuit 430 is coupled to a voltage bias 415 for a PMOS transistor that implements impedance matching stage 410, hence it is labelled as a PMOS voltage bias pmos_vbias in FIG. 5. The PMOS voltage bias pmos_vbias and the common-mode feedback input cm_fb may be coupled to the equivalent point in FIG. 6, as described below. The common-mode feedback circuit X1 compensates for temperature and corner variations in one or more transistor devices that make up the LNA, such as NMOS transistors. By changing the PMOS voltage bias pmos_vbias a NMOS/PMOS ratio can be kept constant across different temperature, ageing and process effects. As described above, this offers a more robust solution.

A specific circuit implementation of an embodiment of the disclosure will now be described with reference to FIG. 6. It should be noted that variations to the topology may be possible while retaining the same functional effects, for example, one resistor could be replaced with two resistors in series or components could be rearranged while still maintaining an equivalent electrical circuit. Hence, the specific circuit implementation of FIG. 6 should not be seen as limiting.

The circuit topology of FIG. 6 has two differential circuits, 605 and 610, which together form a differential circuit pair. Differential circuit 605 is arranged to process signal p whereas differential circuit 610 is arranged to process signal m. Each differential circuit has an input, $in_p$ and $in_m$, and an output, $out_p$ and $out_m$. The topology of FIG. 6 is symmetrical, i.e. the configuration of the first differential circuit 605 is replicated in the second differential circuit 610. The first differential circuit 605 may relate to a non-inverting, "plus" or positive side and the second differential circuit 610 may relate to an inverting, "minus" or negative side of an LNA (or vice versa). In the description below only the first differential circuit 605 will be discussed in detail, but the functionality equally applies to the corresponding second differential circuit 610. In certain embodiments, the functionality of the first differential circuit may alternatively be implemented without the second differential circuit to provide a single-ended amplifier.

In FIG. 6, an impedance matching stage, such as stage 410 in FIG. 4, is implemented by transistors M1_p and M3_p and feedback resistor Rfb. In this example, transistor M1_p is an NMOS transistor and transistor M3_p is a PMOS transistor. Transistors M1_p and M3_p form a (resistor) feedback portion of the LNA. The gate terminal of transistor M1_p is coupled to input inp. The source terminal of transistor M1_p is coupled to ground. The drain terminal of transistor M1_p is coupled to the drain terminal of transistor M3_p via node A. The source terminal of transistor M3_p is coupled to voltage supply vdd. The gate terminal of transistor M3_p is coupled to input inp via AC coupling capacitor acc1_p and is also coupled to pmos_vbias, a PMOS voltage bias provided by amplifier X1, via a resistor Rpv. AC coupling capacitor acc1_p enables an AC signal to pass through from input inp to the gate of transistor M3_p but blocks any DC component so as to isolate the DC voltage bias seen as the gate of transistor M3_p from that seen at the gate of transistor M1_p. This enables the DC voltage bias seen at the gate of the transistor M3_p to be set by pmos_vbias. In this example, applying the PMOS voltage bias pmos_vbias to the gate of PMOS transistor M3_p implements the application of a voltage bias to impedance matching stage 410 as described above with regard to FIG. 4. Resistor Rpv acts to separate the two differential circuits 605 and 610 (i.e. p and m). Without these resistors the PMOS gates of each differential circuit would short-circuit via the gate connections of M3_p and M3_m. In the example of FIG. 6, pmos_vbias is coupled to the output pmos_vbias of amplifier X1 as shown in FIG. 5. The same pmos_vbias is also applied the other differential circuit, i.e. both pmos_vbias nodes are coupled to the pmos_vbias output of amplifier X1. To provide their AC coupling function, the AC coupling capacitor acc1_p need only have a small capacitance, for example less than 1 pF. This minimises the parasitic capacitance at critical nodes with the circuit and minimises the cost and die area required by circuit capacitors.

The transconductances of devices M1_p and M3_p with feedback resistor Rfb matches the input impedance of the LNA shown in FIG. 6 to desired source impedance. For example, in certain implementations this input impedance may be 100 ohms differential, 50 ohms single-ended. Node A may be considered to be the output of an impedance matching stage implemented by transistors M1_p and M3_p and feedback resistor Rfb. Node A is also coupled to the common-mode feedback input cm_fb of amplifier X1 as shown in FIG. 5 via resistor Rcm. Any voltage signal at node A is sensed using resistor Rcm without interfering with any AC signal at node A. This then provides a voltage input signal cm_fb for amplifier X1 as shown in FIG. 5. As described above, a voltage bias vbias is applied to amplifier X1. The amplifier X1, which implements common-mode feedback circuit 430, acts to modify the PMOS voltage bias signal pmos_vbias that biases PMOS transistor M3_p (e.g. sets the operating point for the transistor by setting the voltage at the gate of the transistor) such that, in use, the voltage at node cm_fb equals the voltage bias vbias. As the voltage at node A defines the input bias voltage for M1_p, and the input bias voltage for transistor M2_p as described below, the input bias voltages for the impedance matching stage 410 and the gain stage 420 are, in this example, based on vbias.

In FIG. 6, a gain stage is implemented by transistor M2_p. In FIG. 6, these transistors are NMOS transistors. The gate terminal of transistor M2_p is coupled to the input inp. Hence, the gate terminal is subject to a (DC) voltage bias as set by the voltage at point A and feedback resistor Rfb, i.e. the same voltage bias set for transistor M1_p. The source terminal of transistor M2_p is coupled to ground. The drain terminal of transistor M2_p is coupled to node B. By providing an input bias voltage for the transistors M1_p and M2_p, which in the present example respectively implement the impedance matching stage 410 and the gain stage 420, using the voltage at node A, the use of bias resistors and/or AC-coupling capacitors to bias (i.e. provide a bias input voltage for the gates of) M1_p and M2_p can be avoided. This not only reduces the cost and size of an integrated LNA but it avoids adding to the noise factor of the LNA as discussed above.

In FIG. 6, a signal reuse stage is implemented by transistor M4_p. The source terminal of transistor M4_p is also coupled to node B. A gate terminal of transistor M4_p is coupled to voltage supply vdd via resistor Rm4. In other embodiments, the voltage bias for transistor M4_p could be replaced with an alternate bias voltage, for example a proportion of vdd such as 0.75*vdd. Typically, the gate voltage bias, vdd in this case, is selected such that transistor M4_p operates as a linear amplifier. The gate terminal of transistor M4_p is further coupled to node A via AC coupling capacitor acc2_p. Again, capacitor acc2_p need only be small, e.g. <1 pF, so as to isolate the DC voltage bias applied to the gate terminal of transistor M4_p from the DC voltage of node A but so as to allow AC signal components to pass and be amplified by transistor M4_p. In this way, a signal reuse stage implemented by M4_p, acc2_p, and Rm4 buffers a voltage signal at point A to a current signal input to point B. As can be seen from FIG. 6, each differential circuit only requires a minimum of two AC coupling capacitors which reduces costs and reduces the required die area.

As well as providing an impedance matching function, by its arrangement the impedance matching stage further amplifies the input signal in$_p$, i.e. acts as a constant transconductance (gm) amplifier, to produce an amplified (AC) signal at node A. This amplified signal is "reused" in the first gain stage. In FIG. 6, the amplified signal at node A is applied to the gate terminal of transistor M4_p, which further amplifies the signal to produce a further amplified signal at node B with high current and low noise characteristics, i.e. an amplified current signal with added noise below a particular threshold. In other comparative examples, node A need not be coupled to a further portion of differential circuit 605, i.e. the impedance matching function could be achieved without the coupling of node A and the gate terminal of transistor M4_p. However, certain embodiments use ("reuse" when considering a first use as part of the impedance matching function) the signal at node A to provide better LNA performance. In certain alternative embodiments, another form of coupling other than a buffer or amplifying transistor may be used such that the signal at A is reused at B.

In FIG. 6 a current cascode or current buffer stage is implemented by transistor M5_p. In FIG. 6, transistor M5_p is an NMOS transistor. A source terminal of transistor M5_p is electrically coupled to node B. A drain terminal of transistor M5_p is electrically coupled to node C. A gate terminal of transistor M5_p is coupled to voltage supply vdd as well as a gate terminal of transistor M5_m, which forms part of the second differential circuit 610. For sufficient performance, the gate bias voltage of transistor M5_m should follow the gate bias voltage of transistor M4_m. For example, if the voltage bias for transistor M4_p were replaced with an alternate bias voltage, such as 0.75*vdd, the voltage bias for transistor M5_m should also be replaced with alternate bias voltage (e.g. 0.75*vdd). Node C is at least coupled to output outp and a tuneable LC resonator (labelled as "LC" in FIG. 6). The tuneable LC resonator implements a configurable load that is at least electrically coupled to both drain terminals of transistors M5_(p,m). It comprises a variable capacitor in parallel with a centre-tap differential inductor, said inductor being electrically coupled to the voltage supply vdd. Note that a gate terminal DC voltage for transistors M5_(p,m) can be set to a level other than vdd, such that the drain voltage of transistor M2_p can be set to a desired level in order to increase the available voltage swing at the drain terminal of transistor M5_p. If the gate terminal DC voltage for transistors M5_(p,m) is to be changed, it is recommended to also change the gate terminal DC voltage for transistor M4_p accordingly, so as to maintain sufficient performance characteristics. In some implementations, a current steering cascode X2 may be provided between the drain terminal of each transistor M5_(p,m) and the tuneable LC resonator/each output. A current steering cascode may be used to add gain control between M5_p and the output out$_p$ or to provide further current buffering if this is required.

In FIG. 6, transistors M5_p and M2_p are thus arranged in a cascode configuration, with M2_p providing a common source amplifier and M5_p providing a common gate amplifier. M2_p further shares a common DC current path with both M4_p and M5_p. Transistor M2_p has the largest transconductance (and the highest drain current) of the NMOS transistors. The signal currents though transistors M4_p and M2_p are added constructively in point B. This increases the current gain. Node B thus outputs from the gain stage to the cascode or buffer stage a high signal current with low noise, which is then fed as a current through the M5_p cascode transistor, which is followed by the tuneable LC resonator.

At least resistors Rcm, Rpv, and Rm4 have large values, i.e. values with an order of magnitude around 10 kOhms. The exact values of the resistors, and the capacitors, described herein may be selected using standard design practices, based on implementation specifications.

By reusing a signal generated as part of an impedance matching stage, the current consumption of the LNA can be reduced.

Certain embodiments described herein provide an advantage of achieving good noise performance, i.e. having a low noise factor, without external matching components. Certain embodiments also have a low current consumption, for example when compared with the resistor feedback LNA of FIG. 2. They can be fully integrated differential amplifier on a single chip. By suitably biasing gain and impedance matching stages, in particular transistors implementing those stages, at least one of accurate gain, linearity, noise, and input impedance matching may be achieved despite at least one of differing manufacturing processes, temperature effects, variations in supply voltage and aging conditions. Certain embodiments enable the transconductances of MOSFET devices to be accurately set to mitigate the aforementioned variations. In one embodiment this is achieved by biasing transistors M1 and M2 using resistive feedback and a DC bias point set with a constant transconductance circuit and a common-mode feedback circuit. The use of at least the resistive feedback further avoids the need to use additional DC-biasing resistors to bias voltages seen by transistors M1 and M2. A topology described herein minimises the number of biasing resistors and AC-coupling capacitors, such that costs and die area, i.e. the area taken up by an integrated chip on a substrate, are minimised. This makes certain embodiments attractive for implementations requiring a number of LNA for different frequency bands.

Certain LNA embodiments presented herein provide common-mode matching and good common-mode linearity. They further provide wideband input impedance matching, i.e. impedance matching across a wide range of RF signal frequencies. This wideband matching occurs automatically with no need for specific frequency calibration. For example, the topology of FIG. 6 is capable of matching frequencies in the range 0 to 3 GHz. This is due to there being an absence of frequency selecting components in the topology and the lack of any inductors as a source load, as for example is found with an Ldeg topology. This results in better attenuation against far away signal blockers such as transmitters, wireless networks and Bluetooth signals, as for example compared to the resistor feedback LNA of FIG. 2. Wideband matching further avoids degradation of duplex filter performance, which may occur if the impedance matching does not occur over the frequency range processed by the duplex filter. It also avoids desensitising of a receiver front end and intermodulation products. This is important as typically LNAs without external impedance matching experience blocker signals that may be up to 6 dB greater than those experienced by an LNA with external impedance matching.

The LNA described herein with regard to FIGS. 3 to 6 can be incorporated in a number of different devices. Such a device could comprise a user equipment such as a mobile station, personal digital assistant or cellular radio or telephony device etc.; the LNA may for example be included in a receiver of such a user equipment. Further, such a device could comprise a modem device to be attached to a user equipment, for example a Universal Serial Bus (USB) modem. Still further, such a device could comprise a communication module such as a Machine-to-Machine (M2M) module which can be inserted into another device such as a laptop computer or other device with communication capability (for example a vending machine). Yet, still further, such a device could comprise a chipset which may include radio and baseband parts.

Figure 8:
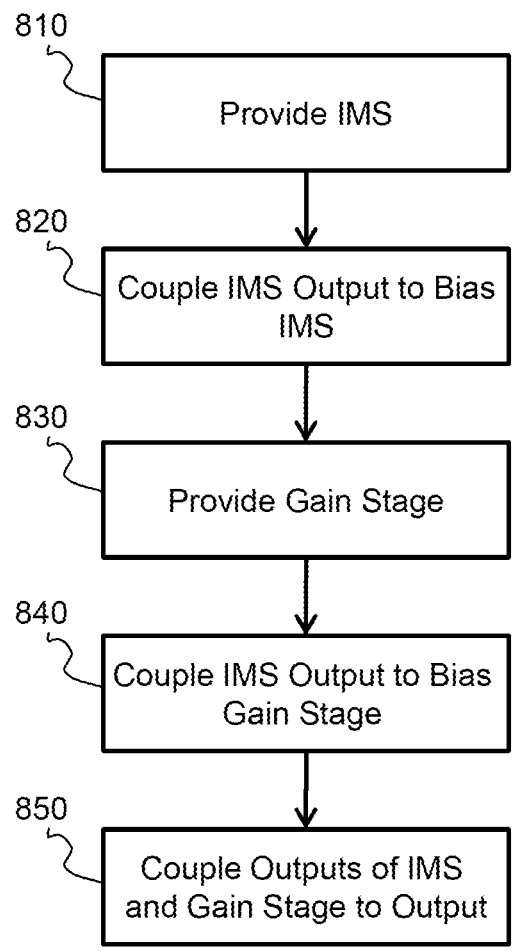
FIG. 8 is a flow chart showing an exemplary method for manufacturing an LNA according to embodiments of the disclosure.

FIG. 8 shows an exemplary method of generating an amplifier according to an embodiment of the disclosure. The order of the steps is not important and may vary based on the manufacture method used, for example the order shown in FIG. 8 may be rearranged with greater or fewer steps. Alternative methods of manufacture that result in the LNA of previously described embodiments may also be used. At step 810, an impedance matching stage (IMS) is provided. This may be achieved by preparing printed circuit boards, semiconductor fabrication methods such as imaging, deposition and etching and/or the application of components, chips or integrated circuits (ICs). At step 820, an output of the impedance matching stage is arranged such that it provides a bias point for said stage, for example using a feedback circuit. This may be achieved, amongst others, by arranging the design of an integrated circuit formed using semiconductor fabrication techniques or by physically coupling the output and the bias location using a conductive material. At step 830, a gain stage is provided. Again similar or different methods to those used for step 810 may be applied. At step 840, the gain stage is configured such that the output of the impedance matching stage provides a bias point for the gain stage. In some embodiments, the output of the impedance matching stage also provides a bias point for a component in the impedance matching stage, e.g. transistor M1. This may be achieved by conductively coupling particular areas of an IC via any required intermediate components as for example, described above. At step 850, the outputs of the impedance matching stage and the gain stage are configured so as to provide an output of the amplifier. For example, this may involve physically coupling an output of the gain stage with the output of a signal reuse stage coupled to an output of the impedance matching stage, such as at node B. Any suitable method of electrically coupling components or arranging elements of an IC may be used.

It will be understood that the circuitry referred to herein may in practice be provided by a single chip or integrated circuit that implements an analogue circuit design. In other embodiments the circuitry may alternatively be implemented by plural chips or integrated circuits, optionally provided as a chipset, an application-specific integrated circuit (ASIC), field-programmable gate array (FPGA), etc. The chip or chips may comprise circuitry (as well as possibly firmware) for embodying radio frequency circuitry, which are configurable so as to operate in accordance with the exemplary embodiments. In this regard, the exemplary embodiments may be implemented at least in part by computer software stored in memory and executable by the processor, or by hardware, or by a combination of tangibly stored software and hardware (and tangibly stored firmware).

Figure 9:
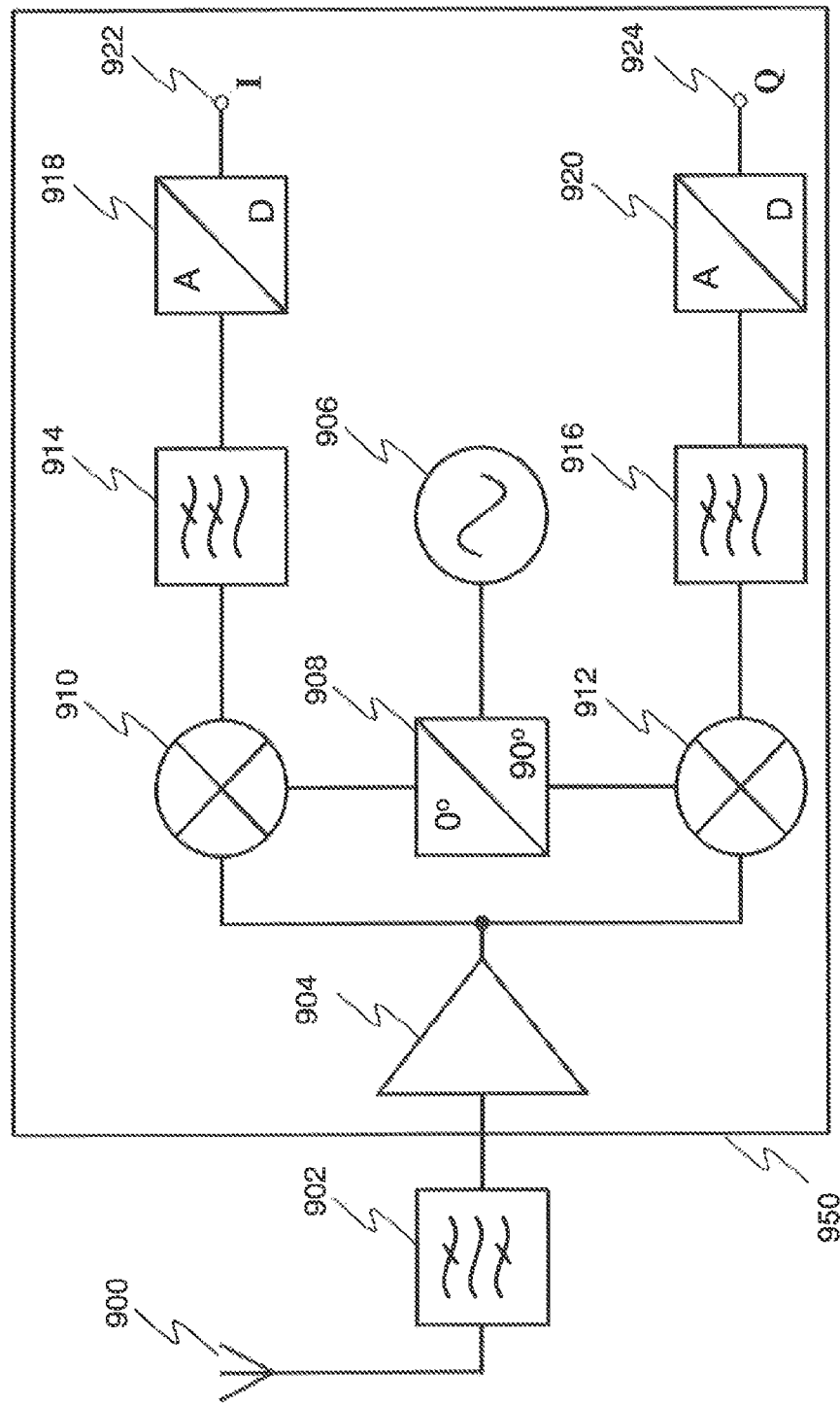
FIG. 9 is a simplified schematic diagram of an exemplary DCR as know in the art.

The above embodiments are to be understood as illustrative examples of the invention. Further embodiments of the invention are envisaged. For example, the transistor M3 can be replaced with an alternative load component, such as a resistor. The LC resonator may also be replaced with an alternative load. The amplifier embodiments described herein may also be used in, amongst others not described, any of the telecommunications receiver systems described herein. Other modifications that provide the same advantages with similar functionality may also be incorporated. Although the term "in parallel" has been used therein the skilled person would understand that a variety of buffering components could be used to delay and/or synchronise various signal paths as described herein. The amplifier embodiments described herein may be used in systems such as those shown in FIGS. 1 and 9.

It is to be understood that any feature described in relation to any one embodiment may be used alone, or in combination with other features described, and may also be used in combination with one or more features of any other of the embodiments, or any combination of any other of the embodiments. Furthermore, equivalents and modifications not described above may also be employed without departing from the scope of the invention, which is defined in the accompanying claims.

The invention claimed is:

1. An amplifier comprising:
an impedance matching stage coupled to an input of the amplifier, the output of the impedance matching stage providing a first, input bias voltage for the impedance matching stage;
a feedback circuit coupled to the output of the impedance matching stage and a first voltage source, the feedback circuit being configured to compensate a second bias voltage for the impedance matching stage; and
a gain stage coupled to the input of the amplifier, the output of the impedance matching stage providing an input bias voltage for the gain stage;
wherein an output of the gain stage and the output of the impedance matching stage are used to produce an output of the amplifier.

2. The amplifier of claim 1, wherein the feedback circuit comprises an amplifier circuit, the output of the impedance matching stage being coupled to an inverting input of the amplifier circuit, the first voltage source being coupled to a non-inverting input of the amplifier circuit and the compensated second bias voltage for the impedance matching stage being set based on the amplifier circuit.

3. The amplifier of claim 1, wherein the impedance matching stage comprises:
a feedback resistor coupled to the input of the amplifier and a first node;
a load component coupled to an output of the feedback circuit and the first node; and
a first NMOS transistor having a source, a gate and a drain, the gate being coupled to the input of the amplifier, the drain being coupled to the first node, the first node providing the output of the impedance matching stage.

4. The amplifier of claim 3, wherein the load component comprises a PMOS transistor having a source, a gate and a drain, the gate of the PMOS transistor being coupled to the output of the feedback circuit to provide the compensated second bias voltage for the impedance matching stage, the drain of the PMOS transistor being coupled to the first node.

5. The amplifier of claim 4, wherein the output of the feedback circuit is coupled to the gate of the PMOS transistor via a first resistor and the input of the feedback circuit is coupled to the first node via a second resistor.

6. The amplifier of claim 5, wherein the gate of the PMOS transistor is coupled to the input of the amplifier via a first AC-coupling capacitor.

7. The amplifier of claim 4, wherein transconductances of the PMOS transistor and the first NMOS transistor and the resistance of the feedback resistor are selected to match a desired source impedance.

8. The amplifier of claim 3, wherein the gain stage comprises:
a second NMOS transistor having a source, a gate and a drain, the gate of the second NMOS transistor being coupled to the input of the amplifier, the drain of the second NMOS transistor comprising the output of the gain stage.

9. The amplifier of claim 1, further comprising:
a signal coupling stage coupled to the output of the impedance matching stage, an output of the signal coupling stage being used together with the output of the gain stage to produce the output of the amplifier.

10. The amplifier of claim 9, wherein the signal coupling stage comprises:
an NMOS transistor having a source, a gate and a drain, the gate being coupled to the output of the impedance matching stage, the source being coupled to the output of the gain stage.

11. The amplifier of claim 10, wherein the gate of the NMOS transistor is coupled to a second voltage source via a resistor to bias the gate, the gate being coupled to the output of the impedance matching stage via an AC-coupling capacitor.

12. The amplifier of claim 1, further comprising:
at least one current cascode located before the output of the amplifier.

13. The amplifier of claim 12, wherein a first one of the at least one current cascode comprises:
an NMOS transistor having a source, a gate and a drain, the source being coupled to at least the output of the gain stage.

14. The amplifier of claim 13, wherein a second one of the at least one current cascade is coupled to the first current cascode between the drain of the NMOS transistor and the output of the amplifier.

15. The amplifier of claim 1, wherein the amplifier comprises a differential amplifier, said stages forming part of one differential circuit of a differential circuit pair.

16. The amplifier of claim 15, wherein one of a configurable load or an LC resonator is coupled between respective outputs of each differential circuit.

17. The amplifier of claim 1, wherein said amplifier is a low noise amplifier in a radio-frequency communications system.

18. A method for amplifying a signal comprising:
inputting the signal to an impedance matching stage;
feeding back an output of the impedance matching stage to an input of the impedance matching stage so as to provide a first, input bias voltage for the impedance matching stage;
compensating a second bias voltage for the impedance matching stage by feeding an output of the impedance matching stage through a feedback circuit comprising an amplifier circuit;
inputting the signal in parallel to a gain stage to produce a first current output;
using the output of the impedance matching stage to provide a second current output;
combining the first and second current outputs to produce a third current output; and
providing an output of the amplifier based on the third current output.

19. A method of manufacturing an amplifier comprising:
providing an impedance matching stage coupled to an input of the amplifier, including coupling an output of the impedance matching stage to provide a first, input bias voltage for the impedance matching stage;
providing a feedback circuit coupled to an output of the impedance matching stage and a voltage source, including arranging the feedback circuit to compensate a second bias voltage for the impedance matching stage;
providing a first gain stage coupled to the input of the amplifier, including arranging the output of the impedance matching stage to provide an input bias voltage for the gain stage; and
providing an output of the amplifier based on the output of the impedance matching stage and an output of the gain stage.

20. The method of manufacturing an amplifier of claim 19, wherein:
providing the feedback circuit comprises providing an amplifier circuit to implement the feedback circuit, including coupling the output of the impedance matching stage to an inverting input of the amplifier circuit, coupling the voltage source to a non-inverting input of the amplifier circuit and setting the compensated second bias voltage for the impedance matching stage based on the output of the amplifier circuit; and
providing an output of the amplifier comprises providing a second gain stage between the output of the impedance matching circuit and the output of the amplifier such that the output of the amplifier is based on the output of the first gain stage and the output of the second gain stage.

21. The amplifier of claim 8, further comprising:
a signal coupling stage coupled to the output of the impedance matching stage, an output of the signal coupling stage being used together with the output of the gain stage to produce the output of the amplifier, wherein the signal coupling stage comprises a third NMOS transistor having a source, a gate and a drain, the gate of the third NMOS transistor being coupled to the output of the impedance matching stage, the source of the third NMOS transistor being coupled to the output of the gain stage.

22. The amplifier of claim 21, wherein:

the load component comprises a PMOS transistor having a source, a gate and a drain, the gate of the PMOS transistor being coupled to the output of the feedback circuit to provide the compensated second bias voltage for the impedance matching stage, the drain of the PMOS transistor being coupled to the first node, the output of the feedback circuit is coupled to the gate of the PMOS transistor via a first resistor and the input of the feedback circuit is coupled to the first node via a second resistor, the gate of the PMOS transistor is coupled to the input of the amplifier via a first AC-coupling capacitor, the gate of the third NMOS transistor is coupled to a second voltage source via a third resistor to bias the gate, the gate of the third NMOS transistor being coupled to the output of the impedance matching stage via a second AC-coupling capacitor.

23. The amplifier of claim 22, comprising:

at least one current cascode located before the output of the amplifier, and wherein a first one of the at least one current cascode comprises:

a fourth NMOS transistor having a source, a gate and a drain, the source of the fourth NMOS transistor being coupled to at least the output of the gain stage.

24. The amplifier of claim 23, wherein a second one of the at least one current cascode is coupled to the first current cascode between the drain of the fourth NMOS transistor and the output of the amplifier.

25. The amplifier of claim 1, wherein the gain stage comprises:

an NMOS transistor having a source, a gate and a drain, the gate of the NMOS transistor being coupled to the input of the amplifier, the drain of the NMOS transistor comprising the output of the gain stage.

* * * * *